United States Patent
Deng et al.

(10) Patent No.: US 11,573,263 B2
(45) Date of Patent: Feb. 7, 2023

(54) PROCESS CORNER DETECTION CIRCUIT AND PROCESS CORNER DETECTION METHOD

(71) Applicant: CHANGXIN MEMORY TECHNOLOGIES, INC., Hefei (CN)

(72) Inventors: Shengcheng Deng, Hefei (CN); Chia-Chi Hsu, Hefei (CN); Anping Qiu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 17/602,947

(22) PCT Filed: Jul. 15, 2021

(86) PCT No.: PCT/CN2021/106529
§ 371 (c)(1),
(2) Date: Oct. 11, 2021

(87) PCT Pub. No.: WO2022/127097
PCT Pub. Date: Jun. 23, 2022

(65) Prior Publication Data
US 2022/0276300 A1  Sep. 1, 2022

(30) Foreign Application Priority Data
Dec. 15, 2020  (CN) .......................... 202011480100.0

(51) Int. Cl.
*G01R 31/28* (2006.01)
*H03K 3/03* (2006.01)
(Continued)

(52) U.S. Cl.
CPC ..... *G01R 31/2882* (2013.01); *G01R 31/2894* (2013.01); *H03K 3/0315* (2013.01); *H03K 17/6872* (2013.01); *H03K 19/20* (2013.01)

(58) Field of Classification Search
None
See application file for complete search history.

(56) References Cited

U.S. PATENT DOCUMENTS

| | | |
|---|---|---|
| 7,868,606 B2 | 1/2011 | Meterelliyoz et al. |
| 10,191,106 B2 | 1/2019 | Pu et al. |
| | (Continued) | |

FOREIGN PATENT DOCUMENTS

| | | |
|---|---|---|
| CN | 105811926 A | 7/2016 |
| CN | 108027402 A | 5/2018 |
| | (Continued) | |

OTHER PUBLICATIONS

International Search Report and English Translation as cited in PCT/CN2021/106529 dated Sep. 28, 2021, 8 pages.
(Continued)

*Primary Examiner* — Jermele M Hollington
(74) *Attorney, Agent, or Firm* — Cooper Legal Group, LLC

(57) ABSTRACT

The present disclosure provides a process corner detection circuit and a process corner detection method. The process corner detection circuit includes: M ring oscillators disposed inside a chip, M≥1, where types of N-type transistors in the M ring oscillators are not exactly the same, and types of P-type transistors in the M ring oscillators are not exactly the same; transistor types of the M ring oscillators include all transistor types used in the chip; the ring oscillators include symmetric ring oscillators and asymmetric ring oscillators; types of N-type transistors and P-type transistors in the symmetric ring oscillators are the same; and types of N-type transistors and P-type transistors in the asymmetric ring oscillators are different.

15 Claims, 6 Drawing Sheets

(51) Int. Cl.
*H03K 17/687* (2006.01)
*H03K 19/20* (2006.01)

(56) References Cited

U.S. PATENT DOCUMENTS

| | | | |
|---|---|---|---|
| 10,482,980 B2 | 11/2019 | Chai | |
| 10,527,667 B2 | 1/2020 | Huang et al. | |
| 2010/0301893 A1* | 12/2010 | Otsuga | G01R 31/31721 324/750.3 |
| 2012/0139624 A1 | 6/2012 | Senthinathan et al. | |
| 2016/0329882 A1 | 11/2016 | Liu et al. | |
| 2017/0089974 A1* | 3/2017 | Pu | H01L 22/14 |
| 2017/0149423 A1* | 5/2017 | Huang | G01R 31/2621 |
| 2017/0219649 A1* | 8/2017 | Shan | G01R 31/2882 |
| 2018/0246160 A1* | 8/2018 | Huang | G01R 31/2856 |
| 2020/0132752 A1* | 4/2020 | Wang | H03K 3/0315 |

FOREIGN PATENT DOCUMENTS

| | | | |
|---|---|---|---|
| CN | 108508340 A | 9/2018 | |
| CN | 109428568 A | 3/2019 | |
| EP | 3353561 B1 | 9/2019 | |
| JP | 4684616 B2 * | 5/2011 | H03K 3/011 |

OTHER PUBLICATIONS

Written Opinion and English Translation as cited in PCT/CN2021/106529 dated Sep. 28, 2021, 7 pages.

* cited by examiner

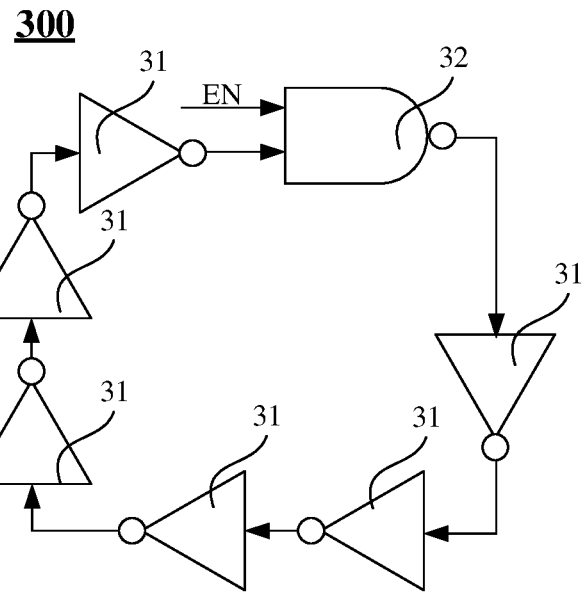

Detect a measured oscillation period of an $m^{th}$ ring oscillator in each of N chips to determine an $m^{th}$ standard oscillation period corresponding to the $m^{th}$ ring oscillator, where the N chips are corresponding to a same wafer — S1

Determine a process corner of each type of transistor in a target chip based on M standard oscillation periods and measured oscillation periods of M ring oscillators in the target chip — S2

S21 — Determine, in the target chip, a reference ring oscillator whose measured oscillation period is equal to a standard oscillation period of a ring oscillator of a same type, wherein each of inverters in the reference ring oscillator includes an $i^{th}$ type of N-type transistor and a $j^{th}$ type of P-type transistor

S22 — Determine an $m1^{th}$ ring oscillator and an $m2^{th}$ ring oscillator in the target chip, where each of the inverters in the $m1^{th}$ ring oscillator includes the $i^{th}$ type of N-type transistor and a $(j+1)^{th}$ type of P-type transistor, and each of the inverters in the $m2^{th}$ ring oscillator includes an $(i+1)^{th}$ type of N-type transistor and the $j^{th}$ type of P-type transistor

S23 — Obtain an $m1^{th}$ measured oscillation period and an $m1^{th}$ standard oscillation period that are corresponding to the $m1^{th}$ ring oscillator, and an $m2^{th}$ measured oscillation period and an $m2^{th}$ standard oscillation period that are corresponding to the $m2^{th}$ ring oscillator

S24 — Determine a process corner of the $(j+1)^{th}$ type of P-type transistor based on a difference between the $m1^{th}$ measured oscillation period and the $m1^{th}$ standard oscillation period

S25 — Determine a process corner of the $(i+1)^{th}$ type of N-type transistor based on a difference between the $m2^{th}$ measured oscillation period and the $m2^{th}$ standard oscillation period

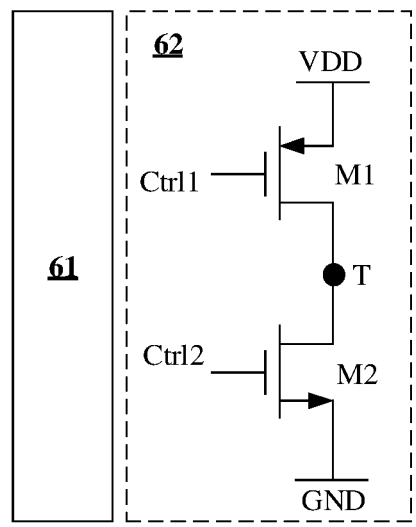

Determine, in a target chip, an $m0^{th}$ ring oscillator whose measured oscillation period is equal to a standard oscillation period of a ring oscillator of a same type — S211

Obtain a voltage at a voltage division test point of a voltage division detection circuit corresponding to the $m0^{th}$ ring oscillator — S212

When the voltage at the voltage division test point is equal to a standard divided voltage corresponding to the $m0^{th}$ ring oscillator, determine the $m0^{th}$ ring oscillator as a reference ring oscillator in the target chip — S213

FIG. 7

| Ring oscillator | Measured oscillation period | Standard oscillation period | Conclusion |
|---|---|---|---|
| NTN+PTN | 4.5ns | 4.5ns | A PTNLV transistor is at a slower process corner |
| NTN+PTNLV | 3ns | 3.2ns | |

FIG. 10

PROCESS CORNER DETECTION CIRCUIT AND PROCESS CORNER DETECTION METHOD

CROSS-REFERENCE TO RELATED APPLICATIONS

The present disclosure is a national stage entry of International Application No. PCT/CN2021/106529, filed on Jul. 15, 2021, which claims the priority to Chinese Patent Application No. 202011480100.0, titled "PROCESS CORNER DETECTION CIRCUIT AND PROCESS CORNER DETECTION METHOD", filed on Dec. 15, 2020. The entire contents of International Application No. PCT/CN2021/106529 and Chinese Patent Application No. 202011480100.0 are incorporated herein by reference.

TECHNICAL FIELD

The present disclosure relates to, but is not limited to, a process corner detection circuit and a process corner detection method.

BACKGROUND

In a chip production process, chips fabricated on different positions of one wafer are usually at different process corners, and transistor parameters of the chips at different process corners are not exactly the same. Process corners need to be considered during the chip design, such that chips produced at various process corners in the design stage can work normally, so as to produce reliable chips.

Process corners usually include typical process corners (T corners), fast process corners (F corners), and slow process corners (S corners), where fast and slow refer to a short delay time or a long delay time of a transistor. For each chip, process corners at which transistors are located are not exactly the same during fabrication. To accurately detect the chip, delay time of each type of transistors in the chip needs to be tested to determine a process corner of this type of transistors.

In related technologies, a process corner of a transistor is usually detected by detecting an electrical parameter of a ring oscillator (with inverters composed of a same type of P-type transistors and N-type transistors) disposed inside a chip and dedicated to detection. However, in this manner, only delay time of a combination of the N-type transistors and the P-type transistors that form the inverter in the ring oscillator can be determined, and process corners of each type of N-type transistor and each type of P-type transistor in the chip cannot be accurately measured. Consequently, a more accurate test result cannot be provided for chip circuit analysis.

SUMMARY

An overview of the subject matter detailed in the present disclosure is provided below, which is not intended to limit the protection scope of the claims.

The present disclosure provides a process corner detection circuit and a process corner detection method.

A first aspect of the present disclosure provides a process corner detection circuit, including: M ring oscillators disposed inside a chip, M≥1, where types of N-type transistors in the M ring oscillators are not exactly the same, and types of P-type transistors in the M ring oscillators are not exactly the same; transistor types of the M ring oscillators include all transistor types used in the chip; the ring oscillators include symmetric ring oscillators and asymmetric ring oscillators; types of N-type transistors and types of P-type transistors in the symmetric ring oscillators are the same; and types of N-type transistors and types of P-type transistors in the asymmetric ring oscillators are different.

A second aspect of the present disclosure provides a process corner detection method, applied to the process corner detection circuit according to the first aspect, including: detecting a measured oscillation period of an $m^{th}$ ring oscillator in each of N chips, to determine an $m^{th}$ standard oscillation period corresponding to the $m^{th}$ ring oscillator, where the N chips are corresponding to a same wafer, N≥1, and m∈[1, M]; and determining a process corner of each type of transistors in a target chip based on M standard oscillation periods and measured oscillation periods of M ring oscillators in the target chip.

Other aspects of the present disclosure are understandable upon reading and understanding the accompanying drawings and detailed description.

BRIEF DESCRIPTION OF THE DRAWINGS

The accompanying drawings incorporated into the specification and constituting a part of the specification illustrate embodiments of the present disclosure, and are used to explain the principles of the embodiments of the present disclosure together with the description. In these accompanying drawings, similar reference numerals are used to represent similar elements. The accompanying drawings in the following description show merely some rather than all of the embodiments of the present disclosure. Persons skilled in the art may derive other accompanying drawings from these accompanying drawings without creative efforts.

FIG. 3 is a schematic diagram of a ring oscillator according to another embodiment of the present disclosure;

FIG. 4 is a flowchart of a process corner detection method according to embodiments of the present disclosure;

FIG. 5 is a subflow chart of step S2 in the method shown in FIG. 4;

FIG. 6 is a schematic diagram of a process corner detection circuit according to an embodiment of the present disclosure;

FIG. 7 is a flowchart of implementing step S21 in FIG. 5 by using the embodiment shown in FIG. 6;

FIG. 10 is a schematic diagram of processes shown in FIG. 8 and FIG. 9.

DETAILED DESCRIPTION

The following clearly and completely describes the technical solutions in the embodiments of the present disclosure with reference to the accompanying drawings in the embodiments of the present disclosure. Apparently, the described embodiments are merely a part rather than all of the embodiments of the present disclosure. All other embodiments obtained by persons skilled in the art based on the embodiments in the present disclosure without creative efforts shall fall within the protection scope of the present disclosure. It should be noted that the embodiments in the present disclosure and features in the embodiments may be arbitrarily combined with each other in a non-conflicting manner.

Exemplary implementations of the present disclosure will be described in detail below with reference to the accompanying drawings.

Figure 1:
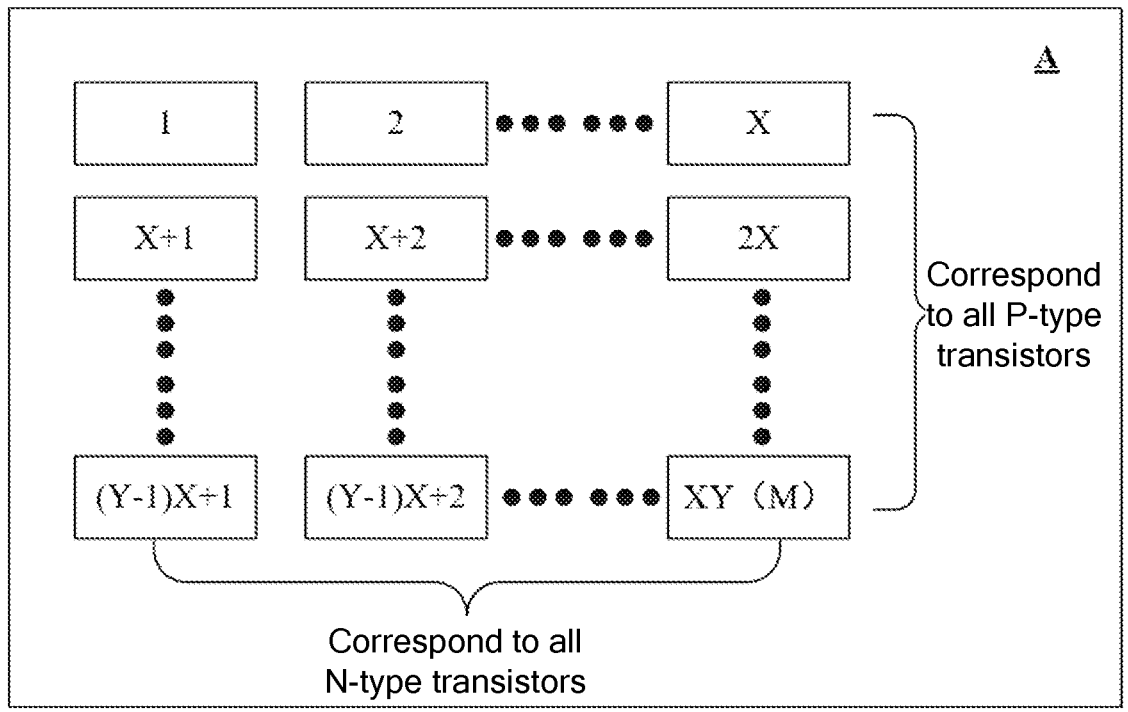
FIG. 1 is a schematic structural diagram of a process corner detection circuit according to an exemplary embodiment of the present disclosure.

FIG. 1 is a schematic structural diagram of a process corner detection circuit according to an exemplary embodiment of the present disclosure.

Referring to FIG. 1, the process corner detection circuit 100 may include:

M ring oscillators 1~XY disposed inside a chip A, M≥1, where types of N-type transistors in the M ring oscillators are not exactly the same, and types of P-type transistors in the M ring oscillators are not exactly the same; transistor types of the M ring oscillators include all transistor types used in the chip A; the ring oscillators include symmetric ring oscillators and asymmetric ring oscillators; types of N-type transistors and types of P-type transistors in the symmetric ring oscillators are the same; and types of N-type transistors and types of P-type transistors in the asymmetric ring oscillators are different.

Each inverter of an $m^{th}$ ring oscillator includes an $i^{th}$ type of N-type transistor and a $j^{th}$ type of P-type transistor, m∈[1, M], i∈[1, X], j∈[1, Y], X is a quantity of types of N-type transistors in the chip, and Y is a quantity of types of P-type transistors in the chip.

In the embodiment shown in FIG. 1, M=XY, X is the quantity of types of N-type transistors in the chip, and Y is the quantity of types of P-type transistors in the chip. In other embodiments, a value of M may be other values, and this is not specially limited in the present disclosure.

Figure 2:
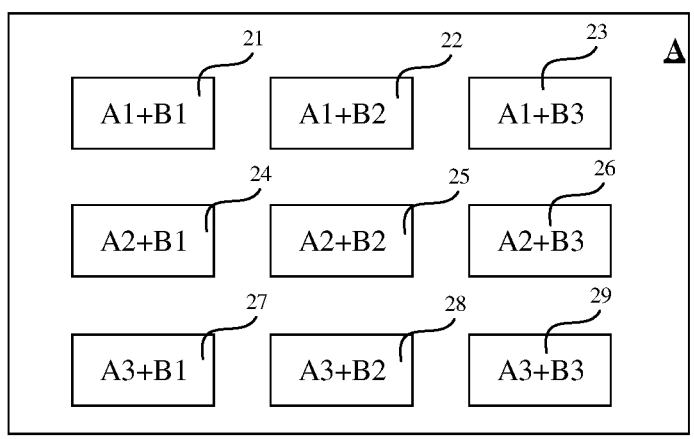
FIG. 2 is a schematic diagram of an arrangement of ring oscillators in a chip according to an embodiment of the present disclosure.

FIG. 2 is a schematic diagram of an arrangement of ring oscillators in a chip according to an embodiment of the present disclosure.

Referring to FIG. 2, assuming that a chip A uses three types of N-type transistors: A1, A2, and A3 and three types of P-type transistors: B1, B2, and B3 (X=3, Y=3), a process corner detection circuit 200 may include 9 (M=3*3) ring oscillators: ring oscillators 21-29.

Each ring oscillator includes an odd number of inverters connected in series in a loop. The inverters in each ring oscillator are exactly the same, and each inverter is composed of one N-type transistor and one P-type transistor. Inverters in the ring oscillator 21 are all composed of A1 and B1 transistors, and the inverters in the ring oscillator 22 are all composed of A1 and B2 transistors, by analogy, the ring oscillator 23 is corresponding to A1 and B3 transistors, the ring oscillator 24 is corresponding to A2 and B1 transistors, the ring oscillator 25 is corresponding to A2 and B2 transistors, the ring oscillator 26 is corresponding to A2 and B3 transistors, the ring oscillator 27 is corresponding to A3 and B1 transistors, and the ring oscillator 28 is corresponding to A3 and B2 transistors, and the ring oscillator 29 is corresponding to A3 and B3 transistors.

In the embodiments of the present disclosure, all types of transistors in the chip include multiple types in following transistors corresponding to a large (large) size, a normal (normal) size, and a small (small) size: ordinary N-type transistor (NMOS), ordinary P-type transistor (PMOS), low-threshold-voltage N-type transistor, low-threshold-voltage P-type transistor, low-threshold-voltage N-type transistor for input and output ports, and low-threshold-voltage P-type transistor for input and output ports.

In the embodiments of the present disclosure, for brief description, a letter code is used to indicate a type of transistor. Letter codes NTN and PTN are set for the ordinary NMOS and the ordinary PMOS, respectively, a suffix "LV" is added after a letter code of the low-threshold-voltage transistor, a suffix "IO" is added after a letter code of a transistor for input and output ports, sizes "small" and "large" of transistors are respectively used as suffixes of letter codes of the transistors, and a transistor of a normal size is not specially marked. For example, NTNLVIO-large represents a large-size low-threshold-voltage N-type transistor for input and output ports.

In the embodiments of the present disclosure, the above letter codes are used for expression, and all the types of transistors in the chip may include NTN, NTN-large, NTN-small, PTN, PTN-large, PTN-small, NTNLV (xxx low Vth), NTNLV-large, NTNLV-small, PTNLV, PTNLV-large, PTNLV-small, NTNLVIO, NTNLVIO-large, NTNLVIO-small, PTNLVIO, PTNLVIO-large, PTNLVIO-small, and the like. The setting of the types of transistors may be determined based on the actual design of the chip, and the present disclosure is not limited thereto.

The ring oscillators in the embodiments of the present disclosure include both symmetric ring oscillators and asymmetric ring oscillators. The symmetrical ring oscillator is a ring oscillator with inverters composed of a same type of P-type transistors and N-type transistors, for example, a ring oscillator with inverters composed of NTN and PTN transistors, a ring oscillator with inverters composed of NTNLV and PTNLV transistors, or a ring oscillator with inverters composed of NTNLV-large and PTNLV-large transistors. The asymmetric ring oscillator is a ring oscillator with inverters composed of different types of N-type transistors and P-type transistors, for example, a ring oscillator with inverters composed of NTN and PTNLV transistors, a ring oscillator with inverters composed of NTNLV and PTNLV-large transistors, or a ring oscillator with inverters composed of NTNLVIO and PTNLV-small transistors. Due to a great variety of transistors, types of transistors are not list one by one in this embodiment of the present disclosure. In the embodiment shown in FIG. 2, A1 and B1 in the ring oscillator 21 may be a same type of transistors or different types of transistors.

FIG. 3 is a schematic diagram of a ring oscillator according to another embodiment of the present disclosure.

Referring to FIG. 3, regardless of which types of transistors are used to form a ring oscillator, in this embodiment of the present disclosure, a ring oscillator 300 may include an even number of inverters 31 and a NAND gate 32 connected in series in a loop. Transistor types of the NAND gate 32 are the same as those of the inverters 31 (that is, the NAND gate 32 and the inverters 31 use a same type of P-type transistors and a same type of N-type transistors). A first input terminal of the NAND gate 32 is connected to an enable control signal EN. A second input terminal of the NAND gate 32 is connected to an output terminal of one inverter, and an output terminal of the NAND gate 32 is connected to an input terminal of another inverter. The enable control signal EN is used to control the running of the ring oscillator.

To avoid an increase in power consumption caused because the ring oscillator starts oscillation when the ring oscillator is not detected, a start-oscillation condition for the ring oscillator is added in this embodiment of the present disclosure. When the enable control signal EN connected to the NAND gate 32 is a low level signal, regardless of a type of an input signal at the second input terminal, the output terminal of the NAND gate 32 outputs a high level signal, and the entire ring oscillator cannot start oscillation. When the enable control signal EN connected to the NAND gate 32 is a high level signal, and an input signal at the second input terminal is a high level signal, the NAND gate 32 outputs a low level signal. When the low level signal is input to the second input terminal of the NAND gate 32 through the even number of inverters, an obtained signal is still a low level signal, so that the output signal of the NAND gate 32 changes to a high level signal. The output signal of the NAND gate 32 may present an oscillating wave including multiple pulses, or in other words, the ring oscillator 300 implements oscillation starting, provided that a status of the enable control signal En remains unchanged.

Through setting, a high level enable control signal EN may be input to the NAND gate 32 only when the ring oscillator 300 is detected, to reduce power consumption of a process corner detection circuit. The ring oscillators shown in FIG. 1 and FIG. 2 each may have a structure that is the same as or similar to that of the ring oscillator 300.

After the ring oscillators shown in FIG. 1 to FIG. 3 are disposed, process corners of various types of transistors in a target chip can be determined based on these ring oscillators.

FIG. 4 is a flowchart of a process corner detection method according to embodiments of the present disclosure. The method shown in FIG. 4 can be applied to a chip including the process corner detection circuit shown in FIG. 1 to FIG. 3.

Referring to FIG. 4, the process corner detection method 400 may include the following steps:

Step S1. Detect a measured oscillation period of an $m^{th}$ ring oscillator in each of N chips to determine an $m^{th}$ standard oscillation period corresponding to the $m^{th}$ ring oscillator, where the N chips are corresponding to a same wafer, N≥1, and m∈[1, M].

Step S2. Determine a process corner of each type of transistors in a target chip based on M standard oscillation periods and measured oscillation periods of M ring oscillators in the target chip.

Because chips fabricated on a same wafer are the same (types of transistors used and process corner detection circuits disposed inside the chips are all the same), for the convenience of description, in this embodiment of the present disclosure, ring oscillators are sorted according to the types, and sequence numbers of ring oscillators of a same type in different chips are the same.

In step S1, actual oscillation periods of ring oscillators of a same type (that is, with a same sequence number) in the N chips from the same wafer can be detected. For example, actual oscillation periods of ring oscillators composed of NTN and PTN transistors in all the chips are detected. Then, these actual oscillation periods are substituted into a preset formula to determine a standard oscillation period corresponding to the ring oscillators composed of NTN and PTN transistors in the N chips. If sequence numbers of the ring oscillators composed of NTN and PTN transistors in all ring oscillators are m, the standard oscillation period is referred to as an $m^{th}$ standard oscillation period. For example, step S1 can be expressed as: Obtain a measured oscillation period Tnm of an $m^{th}$ ring oscillator in an $n^{th}$ chip to obtain a total of N measured oscillation periods: T1m~TNm, where n∈[1, N]; and substitute T1m~TNm into a preset formula to determine an $m^{th}$ standard oscillation period.

In an embodiment of the present disclosure, the preset formula is a mean value formula. In this case, a mean value of actual oscillation periods of all measured ring oscillators may be used as a standard oscillation period corresponding to this type of ring oscillators. In other embodiments, the standard oscillation period may be determined by calculating a modal number, calculating a median, using other functions, or the like. This is not particularly limited in the present disclosure.

FIG. 5 is a subflow chart of step S2 in the method shown in FIG. 4.

Referring to FIG. 5, in one embodiment, step S2 may include the following steps:

Step S21. Determine, in the target chip, a reference ring oscillator whose measured oscillation period is equal to a standard oscillation period of a ring oscillator of a same type, wherein each of inverters in the reference ring oscillator includes an $i^{th}$ type of N-type transistor and a $j^{th}$ type of P-type transistor.

Step S22. Determine an $m1^{th}$ ring oscillator and an $m2^{th}$ ring oscillator in the target chip, where each of the inverters in the $m1^{th}$ ring oscillator includes the $i^{th}$ type of N-type transistor and a $(j+1)^{th}$ type of P-type transistor, and each of the inverters in the $m2^{th}$ ring oscillator includes an $(i+1)^{th}$ type of N-type transistor and the $j^{th}$ type of P-type transistor.

Step S23. Obtain an $m1^{th}$ measured oscillation period and an $m1^{th}$ standard oscillation period that are corresponding to the $m1^{th}$ ring oscillator, and an $m2^{th}$ measured oscillation period and an $m2^{th}$ standard oscillation period that are corresponding to the $m2^{th}$ ring oscillator.

Step S24. Determine a process corner of the $(j+1)^{th}$ type of P-type transistor based on a difference between the $m1^{th}$ measured oscillation period and the $m1^{th}$ standard oscillation period.

Step S25. Determine a process corner of the $(i+1)^{th}$ type of N-type transistor based on a difference between the $m2^{th}$ measured oscillation period and the $m2^{th}$ standard oscillation period.

In this embodiment of the present disclosure, to determine a process corner of each transistor in the target chip, a transistor at a standard process corner in the target chip first needs to be found, and the transistor at the standard process corner is used as a reference for evaluating other transistors. Therefore, to find a reference ring oscillator including a transistor at a standard process corner, two types of transistors of the reference ring oscillator need to be at a typical corner (standard process corner) during production, and have parameters that satisfy a design requirement.

In an embodiment, a ring oscillator whose measured oscillation period is equal to a standard oscillation period may be directly determined as a reference ring oscillator because delay time of inverters of the ring oscillator is closest to a standard value in delay times of inverters of all ring oscillators (that the oscillation period is equal to the standard oscillation period means that the delay time of the inverter is equal to the standard value of the delay time of the inverter). However, the inventor of the present disclosure found in the analysis process that even if delay time of a inverter is equal to a standard value of the delay time of the inverter, it cannot indicate that delay times of both an N-type transistor and a P-type transistor that form the inverter are both the standard value; and if one of the delay times of both the N-type transistor and P-type transistor of the inverter is longer than standard delay time of an N-type transistor of a same type, and the other is shorter than the standard delay time of the N-type transistor of a same type, final delay time of the inverter composed of the N-type transistor and P-type transistor may still be equal to the above standard value of the delay time of the inverter. In this case, if delay times of other transistors are analyzed based on the N-type transistor or the P-type transistor, an error will occur.

To accurately determine an N-type transistor and a P-type transistor that can be used as a reference for delay time comparison, in an embodiment of the present disclosure, another embodiment of a process corner detection circuit is further provided.

FIG. 6 is a schematic diagram of a process corner detection circuit according to an embodiment of the present disclosure.

Referring to FIG. 6, in an embodiment, a chip 600 is further provided with a voltage division detection circuit 62 corresponding to each ring oscillator 61, and the voltage division detection circuit 62 includes at least:

a test P-type transistor M1, where a transistor type of the test P-type transistor is the same as a transistor type of P-type transistors used in inverters of the corresponding ring oscillator 61, a source of the test P-type transistor is connected to a power supply VDD, a gate thereof is connected to a first control signal Ctrl1, a drain thereof is connected to a voltage division test point T, and the first control signal Ctrl1 is used to control the test P-type transistor to be switched on; and a test N-type transistor M2, where a transistor type of the test N-type transistor is the same as a transistor type of N-type transistors used in the inverters of the corresponding ring oscillator 61, a drain of the test N-type transistor is connected to the voltage division test point T, a gate thereof is connected to a second control signal Ctrl2, a source thereof is grounded, and the second control signal Ctrl2 is used to control the test N-type transistor to be switched on.

When it is learned through measurement that a measured oscillation period of the ring oscillator 61 is equal to a standard oscillation period of a ring oscillator of a same type of the ring oscillator 61, the first control signal Ctrl1 (low level) and the second control signal Ctrl2 (high level) are input to the voltage division detection circuit 62 corresponding to the ring oscillator 61, to control the test P-type transistor M1 and the test N-type transistor M2 to be switched on. Because equivalent resistances of transistors at different process corners are different, divided voltages formed at the voltage division test point T are different. Therefore, whether the test P-type transistor M1 and the test N-type transistor M2 are respectively a reference N-type transistor and a reference P-type transistor whose delay times are respectively equal to standard values of transistors of same types as the test P-type transistor M1 and the test N-type transistor M2 can be determined through divided voltage detection.

FIG. 7 is a flowchart of implementing step S21 in FIG. 5 by using the embodiment shown in FIG. 6.

Referring to FIG. 7, for the voltage division detection circuit shown in FIG. 6, step S21 may include the following steps:

Step S211. Determine, in the target chip, an $m0^{th}$ ring oscillator whose measured oscillation period is equal to a standard oscillation period of a ring oscillator of a same type.

Step S212. Obtain a voltage at a voltage division test point of a voltage division detection circuit corresponding to the $m0^{th}$ ring oscillator.

Step S213. When the voltage at the voltage division test point is equal to a standard divided voltage corresponding to the $m0^{th}$ ring oscillator, determine the $m0^{th}$ ring oscillator as the reference ring oscillator in the target chip.

For example, a process of determining the standard divided voltage corresponding to the $m0^{th}$ ring oscillator may include: obtaining N voltages at voltage division test points of voltage division detection circuits corresponding to $m0^{th}$ ring oscillators in the N chips, and determining a mean value of the N voltages as the standard divided voltage corresponding to the $m0^{th}$ ring oscillator. In other embodiments of the present disclosure, the standard divided voltage may alternatively be determined with reference to the preset formula applied in the process of determining the standard oscillation period. This is not particularly limited in the present disclosure.

In some embodiments, it is possible that no ring oscillator whose measured oscillation period is equal to a standard oscillation period is found in a target chip or a voltage at a voltage division test point corresponding to a ring oscillator whose measured oscillation period is equal to a standard oscillation period is unequal to a standard divided voltage. Both cases may be considered that there is no reference ring oscillator in the target chip. In this case, it can be determined that there is no transistor at a standard process corner in the target chip, and the target chip is marked as a chip with an unqualified process deviation.

In other embodiments, it is possible that multiple ring oscillators that satisfy the above condition of the reference ring oscillator may be found in a target chip. In this case, any ring oscillator that satisfies the condition may be selected as a reference ring oscillator used in subsequent steps.

If the reference ring oscillator in the target chip can be determined according to the embodiment shown in FIG. 7, it can be determined that equivalent resistances (positively related to delay times) of N-type transistors and P-type transistors in the reference ring oscillator are standard values. In this case, the N-type transistors (referred to as reference N-type transistors) and the P-type transistors (referred to as reference P-type transistors) in the reference ring oscillator may be used as a comparison reference for measuring whether delay times of other transistors are shorter delay time, longer delay time, or standard delay time.

First, an $m1^{th}$ ring oscillator including the reference N-type transistors is found in the target chip. The $m1^{th}$ ring oscillator is different from the foregoing $m^{th}$ ring oscillator, or in other words, P-type transistors in the $m1^{th}$ ring oscillator are not reference P-type transistors. In this case, an $m1^{th}$ measured oscillation period and an $m1^{th}$ standard oscillation period (measured oscillation periods of a ring oscillators of a same type are calculated according to the foregoing preset formula) of the $m1^{th}$ ring oscillator may be obtained, and a difference between the $m1^{th}$ measured oscillation period and the $m1^{th}$ standard oscillation period is determined.

Because the $m1^{th}$ ring oscillator uses the reference N-type transistors, if the P-type transistors in the $m1^{th}$ ring oscillator have longer delay time than a P-type transistor of a same type (the P-type transistors in the $m1^{th}$ ring oscillator are at a slower process corner), an oscillation period of the $m1^{th}$ ring oscillator composed of inverters each including the reference N-type transistor and the P-type transistor is longer than a standard oscillation period of a ring oscillator of a same type. Similarly, if the P-type transistors in the $m1^{th}$ ring oscillator have shorter delay time than a P-type transistor of a same type (the P-type transistors in the $m1^{th}$ ring oscillator are at a faster process corner), an oscillation period of the $m1^{th}$ ring oscillator composed of inverters each including the reference N-type transistor and the P-type transistor is shorter than a standard oscillation period of a ring oscillator of a same type. Therefore, whether delay time of the P-type transistors in the $m1^{th}$ ring oscillator is longer or shorter may be determined according to the difference between the $m1^{th}$ actual measured oscillation period and the $m1^{th}$ standard oscillation period.

Figure 8:
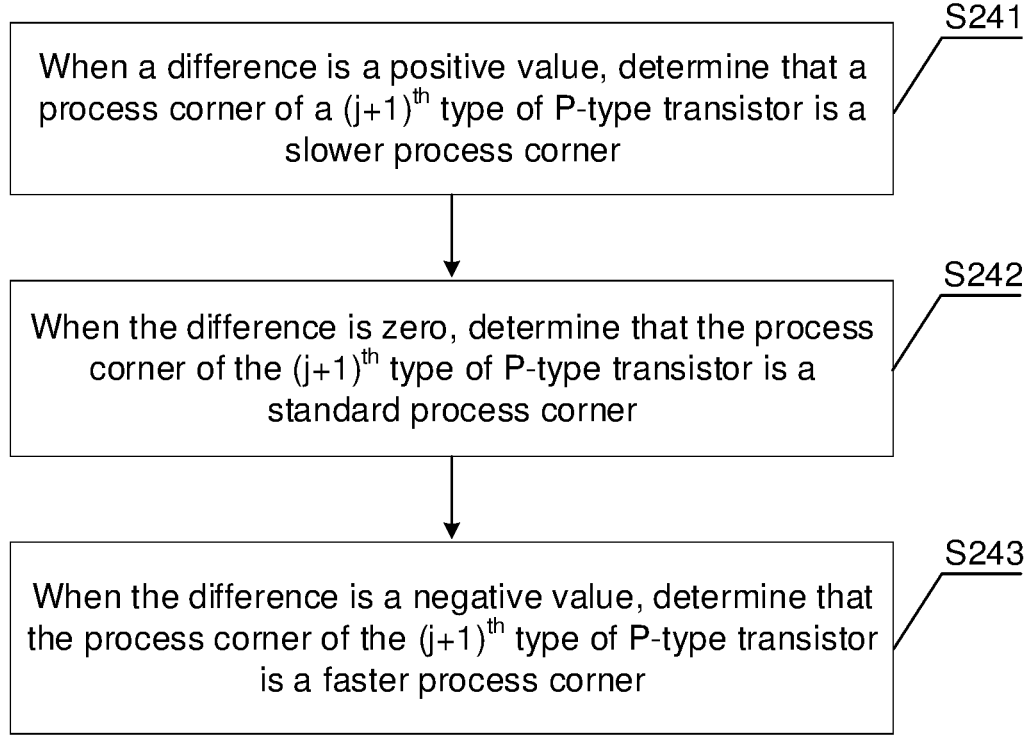
FIG. 8 is a subflow chart of step S24 according to an embodiment.

FIG. 8 is a subflow chart of step S24 according to an embodiment.

Referring to FIG. 8, step S24 may include the following steps:

Step S241. When the difference is a positive value, determine that the process corner of the $(j+1)^{th}$ type of P-type transistor is a slower process corner.

Step S242. When the difference is zero, determine that the process corner of the $(j+1)^{th}$ type of P-type transistor is a standard process corner.

Step S243. When the difference is a negative value, determine that the process corner of the $(j+1)^{th}$ type of P-type transistor is a faster process corner.

The $(j+1)^{th}$ type of P-type transistor generally refers to a P-type transistor whose type is different from that of the forgoing reference P-type transistor, and is not limited to one type of transistor. For example, the $(j+1)^{th}$ type of P-type transistor may be all types of P-type transistors applied to the target chip except the reference P-type transistor. When a quantity of ring oscillators of the target chip is M=XY, the reference N-type transistors and each type of P-type transistors are combined into Y ring oscillators. Therefore, a process corner of each type of P-type transistor in the target chip may be determined by measuring a difference between a measured oscillation period and a standard oscillation period of each of Y−1 ring oscillators (the reference ring oscillator is removed from the Y ring oscillators).

Then, an m2$^{th}$ ring oscillator including the reference P-type transistors is found in the target chip. The m2$^{th}$ ring oscillator is different from the foregoing m$^{th}$ ring oscillator, or in other words, N-type transistors in the m2$^{th}$ ring oscillator are not reference N-type transistors. In this case, an m2$^{th}$ measured oscillation period and an m2$^{th}$ standard oscillation period (measured oscillation periods of a ring oscillators of a same type are calculated according to the foregoing preset formula) of the m2$^{th}$ ring oscillator may be obtained, and a difference between the m2$^{th}$ measured oscillation period and the m2$^{th}$ standard oscillation period is determined.

Because the m2$^{th}$ ring oscillator uses the reference P-type transistors, if the N-type transistors in the m2$^{th}$ ring oscillator have longer delay time than an N-type transistor of a same type (the N-type transistors in the m2$^{th}$ ring oscillator are at a slower process corner), an oscillation period of the m2$^{th}$ ring oscillator composed of inverters each including the reference P-type transistor and the N-type transistor is longer than a standard oscillation period of a ring oscillator of a same type. Similarly, if the N-type transistors in the m2$^{th}$ ring oscillator have shorter delay time than an N-type transistor of a same type (the N-type transistors in the m2$^{th}$ ring oscillator are at a faster process corner), an oscillation period of the m2$^{th}$ ring oscillator composed of inverters each including the reference P-type transistor and the N-type transistor is shorter than a standard oscillation period of a ring oscillator of a same type. Therefore, whether delay time of the N-type transistors in the m2$^{th}$ ring oscillator is longer or shorter may be determined according to the difference between the m2$^{th}$ actual measured oscillation period and the m2$^{th}$ standard oscillation period.

Figure 9:
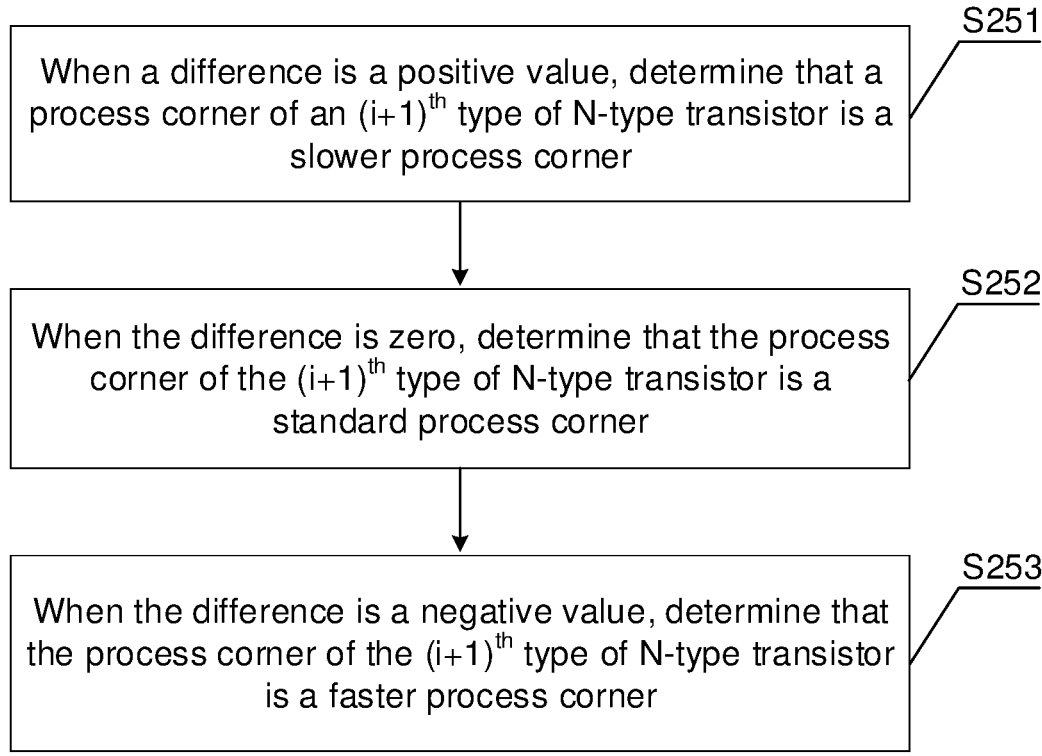
FIG. 9 is a subflow chart of step S25 according to an embodiment.

FIG. 9 is a subflow chart of step S25 according to an embodiment.

Referring to FIG. 9, step S25 may include the following steps:

Step S251. When the difference is a positive value, determine that the process corner of the $(i+1)^{th}$ type of N-type transistor is a slower process corner.

Step S252. When the difference is zero, determine that the process corner of the $(i+1)^{th}$ type of N-type transistor is a standard process corner.

Step S253. When the difference is a negative value, determine that the process corner of the $(i+1)^{th}$ type of N-type transistor is a faster process corner.

The $(i+1)^{th}$ type of N-type transistor generally refers to an N-type transistor whose type is different from that of the forgoing reference N-type transistor, and is not limited to one type of transistor. For example, the $(i+1)^{th}$ type of N-type transistor may be all types of N-type transistors applied to the target chip except the reference N-type transistor. When a quantity of ring oscillators of the target chip is M=XY, the reference P-type transistors and each type of N-type transistors are combined into X ring oscillators. Therefore, a process corner of each type of N-type transistor in the target chip may be determined by measuring a difference between a measured oscillation period and a standard oscillation period of each of X−1 ring oscillators (the reference ring oscillator is removed from the X ring oscillators).

FIG. 10 is a schematic diagram of the processes shown in FIG. 8 and FIG. 9.

Referring to FIG. 10, if a reference ring oscillator found in a target chip is composed of NTN transistors and PTN transistors, a measured oscillation period corresponding to the reference ring oscillator is 4.5 ns, and a standard oscillation period corresponding to the reference ring oscillator is 4.5 ns, in the target chip, the NTN transistors are reference N-type transistors, and the PTN transistors are reference P-type transistors. In this case, a measured oscillation period of a ring oscillator composed of the reference N-type transistors and other type of P-type transistors (such as PTNLV transistors) is 3 ns, and a standard oscillation period of this type of ring oscillator is 3.2 ns. Therefore, it can be determined that delay time of the PTNLV transistor is shorter than a standard value, and a process corner corresponding to the PTNLV transistors in the target chip is a faster process corner.

In conclusion, in the embodiments of the present disclosure, ring oscillators composed of different types of N-type transistors and different types of P-type transistors are disposed, and a reference ring oscillator is found in a target chip to determine process corners of other transistors in the target chip, so as to accurately measure a process corner of each type of transistors in the target chip. Moreover, a voltage division circuit corresponding to each type of ring oscillator is disposed, and a voltage at a voltage division test point is detected to determine whether the ring oscillator is a reference oscillator. In this way, a measurement error caused because a difference between delay time of an N-type transistor and a reference value cancels out a difference between delay time of a P-type transistor and a reference value can be avoided, thereby improving accuracy of process corner detection.

Each embodiment or implementation in the specification is described in a progressive manner. Each embodiment focuses on the difference from other embodiments, and the same and similar parts between the embodiments may refer to each other.

In the descriptions of this specification, a description with reference to the terms "embodiment", "exemplary embodiment", "some implementations", "an exemplary implementation", "an example", and the like means that a specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific features, structures, materials or characteristics may be combined in an appropriate manner in any one or more implementations or examples.

It should be understood that, in the descriptions of the present disclosure, orientations or position relationships indicated by terms such as "center", "upper", "lower", "left", "right", "vertical", "horizontal", "inside", and "outside" are orientations or position relationships based on illustrations in the accompanying drawings. The terms are merely intended to facilitate and simplify the descriptions of the present disclosure, but are not intended to indicate or imply that an indicated apparatus or element needs to have a particular orientation and needs to be constructed and operated in a particular orientation, and therefore cannot be construed as a limitation on the present disclosure.

It can be understood that the terms "first", "second", and the like used in the present disclosure can be used to describe various structures in the present disclosure, but these structures are not limited by these terms. These terms are only used to distinguish a first structure from another structure.

In one or more drawings, same components are represented by similar reference numerals. For clarity, various parts in the accompanying drawings are not drawn to scale. In addition, some well-known parts may not be shown. For brevity, a structure obtained after several steps are implemented may be described in one drawing. In the following, many specific details in the present disclosure are described, for example, structures, materials, and dimensions of devices, and processing processes and technologies for the devices, to understand the present disclosure more clearly. However, as persons skilled in the art can understand, the present disclosure may not be implemented according to these specific details.

Finally, it should be noted that the above embodiments are merely intended to describe the technical solutions of the present disclosure, rather than to limit the present disclosure. Although the present disclosure is described in detail with reference to the above embodiments, persons skilled in the art should understand that they may still make modifications to the technical solutions described in the above embodiments or make equivalent replacements to some or all technical features thereof, and these modifications and equivalent replacements do not make the essences of the corresponding technical solutions depart from the scope of the technical solutions in the embodiments of the present disclosure.

INDUSTRIAL APPLICABILITY

In the process corner detection circuit and the process corner detection method provided in the embodiments of the present disclosure, ring oscillators composed of different types of N-type transistors and different types of P-type transistors are disposed inside a chip, so that process corners of different types of N-type transistors and different types of P-type transistors in the chip can be accurately measured, thereby providing effective information for chip detection.

The invention claimed is:

1. A process corner detection circuit, comprising:
M ring oscillators disposed inside a chip, M≥1, wherein types of N-type transistors in the M ring oscillators are not exactly the same, and types of P-type transistors in the M ring oscillators are not exactly the same; transistor types of the M ring oscillators comprise all transistor types used in the chip; the ring oscillators comprise symmetric ring oscillators and asymmetric ring oscillators; types of N-type transistors and types of P-type transistors in the symmetric ring oscillators are the same; and types of N-type transistors and types of P-type transistors in the asymmetric ring oscillators are different; and
the chip is further provided with a voltage division detection circuit corresponding to each of the ring oscillators, and the voltage division detection circuit comprises at least:
a test P-type transistor, wherein a transistor type of the test P-type transistor is the same as a transistor type of P-type transistors used in inverters of the corresponding ring oscillator, a source of the test P-type transistor is connected to a power supply, a gate of the test P-type transistor is connected to a first control signal, a drain of the test P-type transistor is connected to a voltage division test point, and the first control signal is used to control the test P-type transistor to be switched on; and
a test N-type transistor, wherein a transistor type of the test N-type transistor is the same as a transistor type of N-type transistors used in the inverters of the corresponding ring oscillator, a drain of the test N-type transistor is connected to the voltage division test point, a gate of the test N-type transistor is connected to a second control signal, a source of the test N-type transistor is grounded, and the second control signal is used to control the test N-type transistor to be switched on.

2. The process corner detection circuit according to claim 1, wherein each inverter of an $m^{th}$ ring oscillator comprises an $i^{th}$ type of N-type transistor and a $j^{th}$ type of P-type transistor, $m \in [1, M]$, $i \in [1, X]$, $j \in [1, Y]$, X is a quantity of types of N-type transistors in the chip, Y is a quantity of types of P-type transistors in the chip, M=XY.

3. The process corner detection circuit according to claim 1, wherein at least one of the ring oscillators comprises an even number of inverters and one NAND gate connected in series in a loop, transistor types of the NAND gate are the same as transistor types of the inverters, a first input terminal of the NAND gate is connected to an enable control signal, a second input terminal of the NAND gate is connected to an output terminal of one of the inverters, an output terminal of the NAND gate is connected to an input terminal of another one of the inverters, the enable control signal is used to control operation of the at least one of the ring oscillators; when the enable control signal is a low level signal, the at least one of the ring oscillators does not start oscillation; and when the enable control signal is a high level signal and an input signal at the second input terminal of the NAND gate is a high level signal, the at least one of the ring oscillators starts oscillation.

4. A process corner detection method, applied to a process corner detection circuit; wherein the process corner detection circuit comprises: M ring oscillators disposed inside a chip, M≥1, wherein types of N-type transistors in the M ring oscillators are not exactly the same, and types of P-type transistors in the M ring oscillators are not exactly the same; transistor types of the M ring oscillators comprise all transistor types used in the chip; the ring oscillators comprise symmetric ring oscillators and asymmetric ring oscillators; types of N-type transistors and types of P-type transistors in the symmetric ring oscillators are the same; and types of N-type transistors and types of P-type transistors in the asymmetric ring oscillators are different; and the process corner detection method comprises:
  detecting a measured oscillation period of an $m^{th}$ ring oscillator in each of N chips, to determine an $m^{th}$ standard oscillation period corresponding to the $m^{th}$ ring oscillator, wherein the N chips are corresponding to a same wafer, N≥1, and m∈[1, M]; and
  determining a process corner of each type of transistors in a target chip based on M standard oscillation periods and measured oscillation periods of M ring oscillators in the target chip;
  wherein the detecting a measured oscillation period of an $m^{th}$ ring oscillator in each of N chips to determine an $m^{th}$ standard oscillation period corresponding to the $m^{th}$ ring oscillator comprises:
    obtaining a measured oscillation period Tnm of an $m^{th}$ ring oscillator in an $n^{th}$ chip, wherein n∈[1, N]; and
    substituting T1m~TNm into a preset formula to determine the $m^{th}$ standard oscillation period;
  wherein the preset formula is a mean value formula, and a mean value of the T1m~Tnm is used as the $m^{th}$ standard oscillation period;
  wherein the determining a process corner of each type of transistors in a target chip based on M standard oscillation periods comprises:
    determining, in the target chip, a reference ring oscillator whose measured oscillation period is equal to a standard oscillation period of a ring oscillator of a same type, wherein each of inverters in the reference ring oscillator comprises an $i^{th}$ type of N-type transistor and a $j^{th}$ type of P-type transistor;
    determining an $m1^{th}$ ring oscillator and an $m2^{th}$ ring oscillator in the target chip, wherein each of the inverters in the $m1^{th}$ ring oscillator comprises the $i^{th}$ type of N-type transistor and a $(j+1)^{th}$ type of P-type transistor, and each of the inverters in the $m2^{th}$ ring oscillator comprises an $(i+1)^{th}$ type of N-type transistor and the $i^{th}$ type of P-type transistor;
    obtaining an $m1^{th}$ measured oscillation period and an $m1^{th}$ standard oscillation period that are corresponding to the $m1^{th}$ ring oscillator, and an $m2^{th}$ measured oscillation period and an $m2^{th}$ standard oscillation period that are corresponding to the $m2^{th}$ ring oscillator;
    determining a process corner of the $(j+1)^{th}$ type of P-type transistor based on a difference between the $m1^{th}$ measured oscillation period and the $m1^{th}$ standard oscillation period; and
    determining a process corner of the $(i+1)^{th}$ type of N-type transistor based on a difference between the $m2^{th}$ measured oscillation period and the $m2^{th}$ standard oscillation period.

5. The process corner detection method according to claim 4, wherein the determining a process corner of the $(j+1)^{th}$ type of P-type transistor based on a difference between the $m1^{th}$ measured oscillation period and the $m1^{th}$ standard oscillation period comprises:
  when the difference is a positive value, determining that the process corner of the $(j+1)^{th}$ type of P-type transistor is a slower process corner;
  when the difference is zero, determining that the process corner of the $(j+1)^{th}$ type of P-type transistor is a standard process corner; and
  when the difference is a negative value, determining that the process corner of the $(j+1)^{th}$ type of P-type transistor is a faster process corner.

6. The process corner detection method according to claim 4, wherein the determining a process corner of the $(i+1)^{th}$ type of N-type transistor based on a difference between the $m2^{th}$ measured oscillation period and the $m2^{th}$ standard oscillation period comprises:
  when the difference is a positive value, determining that the process corner of the $(i+1)^{th}$ type of N-type transistor is a slower process corner;
  when the difference is zero, determining that the process corner of the $(i+1)^{th}$ type of N-type transistor is a standard process corner; and
  when the difference is a negative value, determining that the process corner of the $(i+1)^{th}$ type of N-type transistor is a faster process corner.

7. The process corner detection method according to claim 4, wherein the determining, in the target chip, a reference ring oscillator whose measured oscillation period is equal to a standard oscillation period of a ring oscillator of a same type comprises:
  when there is no reference ring oscillator in the target chip, marking the target chip as a chip with an unqualified process deviation.

8. The process corner detection method according to claim 4, wherein the chip is further provided with a voltage division detection circuit corresponding to each of the ring oscillators, and the voltage division detection circuit comprises at least:
  a test P-type transistor, wherein a transistor type of the test P-type transistor is the same as a transistor type of P-type transistors used in inverters of the corresponding ring oscillator, a source of the test P-type transistor is connected to a power supply, a gate of the test P-type transistor is connected to a first control signal, a drain of the test P-type transistor is connected to a voltage division test point, and the first control signal is used to control the test P-type transistor to be switched on; and
  a test N-type transistor, wherein a transistor type of the test N-type transistor is the same as a transistor type of N-type transistors used in the inverters of the corresponding ring oscillator, a drain of the test N-type transistor is connected to the voltage division test point, a gate of the test N-type transistor is connected to a second control signal, a source of the test N-type transistor is grounded, and the second control signal is used to control the test N-type transistor to be switched on;
  the determining, in the target chip, a reference ring oscillator whose measured oscillation period is equal to a standard oscillation period of a ring oscillator of a same type comprises:
    determining, in the target chip, an $m0^{th}$ ring oscillator whose measured oscillation period is equal to a standard oscillation period of a ring oscillator of a same type;
    obtaining a voltage at the voltage division test point of a voltage division detection circuit corresponding to the $m0^{th}$ ring oscillator; and
    when the voltage at the voltage division test point is equal to a standard divided voltage corresponding to the $m0^{th}$ ring oscillator, determining the $m0^{th}$ ring oscillator as the reference ring oscillator in the target chip.

9. The process corner detection method according to claim 8, wherein the determining a process corner of the $(j+1)^{th}$ type of P-type transistor based on a difference between the $m1^{th}$ measured oscillation period and the $m1^{th}$ standard oscillation period comprises:

when the difference is a positive value, determining that the process corner of the $(j+1)^{th}$ type of P-type transistor is a slower process corner;

when the difference is zero, determining that the process corner of the $(j+1)^{th}$ type of P-type transistor is a standard process corner; and when the difference is a negative value, determining that the process corner of the $(j+1)^{th}$ type of P-type transistor is a faster process corner.

10. The process corner detection method according to claim 8, wherein the determining a process corner of the $(i+1)^{th}$ type of N-type transistor based on a difference between the m2$^{th}$ measured oscillation period and the m2$^{th}$ standard oscillation period comprises:

when the difference is a positive value, determining that the process corner of the $(i+1)^{th}$ type of N-type transistor is a slower process corner;

when the difference is zero, determining that the process corner of the $(i+1)^{th}$ type of N-type transistor is a standard process corner; and when the difference is a negative value, determining that the process corner of the $(i+1)^{th}$ type of N-type transistor is a faster process corner.

11. The process corner detection method according to claim 8, wherein the determining, in the target chip, a reference ring oscillator whose measured oscillation period is equal to a standard oscillation period of a ring oscillator of a same type comprises:

when there is no reference ring oscillator in the target chip, marking the target chip as a chip with an unqualified process deviation.

12. The process corner detection method according to claim 8, wherein a process of determining the standard divided voltage corresponding to the m0$^{th}$ ring oscillator comprises:

obtaining N voltages at voltage division test points of voltage division detection circuits corresponding to m0$^{th}$ ring oscillators in the N chips; and determining a mean value of the N voltages as the standard divided voltage corresponding to the m0$^{th}$ ring oscillator.

13. The process corner detection method according to claim 12, wherein the determining a process corner of the $(j+1)^{th}$ type of P-type transistor based on a difference between the m1$^{th}$ measured oscillation period and the m1$^{th}$ standard oscillation period comprises:

when the difference is a positive value, determining that the process corner of the $(j+1)^{th}$ type of P-type transistor is a slower process corner;

when the difference is zero, determining that the process corner of the $(j+1)^{th}$ type of P-type transistor is a standard process corner; and when the difference is a negative value, determining that the process corner of the $(j+1)^{th}$ type of P-type transistor is a faster process corner.

14. The process corner detection method according to claim 12, wherein the determining a process corner of the $(i+1)^{th}$ type of N-type transistor based on a difference between the m2$^{th}$ measured oscillation period and the m2$^{th}$ standard oscillation period comprises:

when the difference is a positive value, determining that the process corner of the $(i+1)^{th}$ type of N-type transistor is a slower process corner;

when the difference is zero, determining that the process corner of the $(i+1)^{th}$ type of N-type transistor is a standard process corner; and when the difference is a negative value, determining that the process corner of the $(i+1)^{th}$ type of N-type transistor is a faster process corner.

15. The process corner detection method according to claim 12, wherein the determining, in the target chip, a reference ring oscillator whose measured oscillation period is equal to a standard oscillation period of a ring oscillator of a same type comprises:

when there is no reference ring oscillator in the target chip, marking the target chip as a chip with an unqualified process deviation.

\* \* \* \* \*